United States Patent
Noguchi et al.

(10) Patent No.: US 11,658,261 B2
(45) Date of Patent: May 23, 2023

(54) METHOD OF MANUFACTURING NITRIDE SEMICONDUCTOR DEVICE

(71) Applicant: NICHIA CORPORATION, Anan (JP)

(72) Inventors: Masahiro Noguchi, Anan (JP); Hideyuki Gono, Anan (JP)

(73) Assignee: NICHIA CORPORATION, Anan (JP)

( * ) Notice: Subject to any disclaimer, the term of this patent is extended or adjusted under 35 U.S.C. 154(b) by 188 days.

(21) Appl. No.: 17/122,825

(22) Filed: Dec. 15, 2020

(65) Prior Publication Data

US 2021/0193864 A1 Jun. 24, 2021

(30) Foreign Application Priority Data

Dec. 20, 2019 (JP) .............................. JP2019-230440

(51) Int. Cl.
*H01L 33/32* (2010.01)
*H01L 33/00* (2010.01)

(52) U.S. Cl.
CPC ........ *H01L 33/0075* (2013.01); *H01L 33/325* (2013.01)

(58) Field of Classification Search
CPC ... H01L 33/007; H01L 33/0075; H01L 33/00; H01L 33/32; H01L 33/325
See application file for complete search history.

(56) References Cited

U.S. PATENT DOCUMENTS

| | | | |
|---|---|---|---|
| 7,282,744 B2 | 10/2007 | Flynn et al. | |
| 7,615,798 B2 | 11/2009 | Sanga et al. | |
| 2004/0061119 A1* | 4/2004 | Inoue | H01L 33/02 257/79 |
| 2007/0096077 A1* | 5/2007 | Sanga | H01S 5/32341 257/E33.033 |
| 2017/0309780 A1* | 10/2017 | Park | H01L 33/06 |
| 2019/0067521 A1 | 2/2019 | Takano et al. | |

FOREIGN PATENT DOCUMENTS

| | | | |
|---|---|---|---|
| JP | 2005-317931 A | 11/2005 | |
| JP | 2007-504682 A | 3/2007 | |
| JP | 2007-095823 A | 4/2007 | |
| JP | 2008-311420 A | 12/2008 | |
| JP | 2017-139252 A | 8/2017 | |
| WO | WO-2005081328 A1 * | 9/2005 | ............. H01L 33/40 |

* cited by examiner

*Primary Examiner* — Matthew C Landau
*Assistant Examiner* — Dmitriy Yemelyanov
(74) *Attorney, Agent, or Firm* — Foley & Lardner LLP

(57) ABSTRACT

A method of manufacturing a nitride semiconductor device includes: forming a first semiconductor layer containing Al, Ga, and N and having a first thickness by doping a p-type impurity; forming a second semiconductor layer over the first semiconductor layer without doping an n-type impurity and without doping a p-type impurity, the second semiconductor layer containing Al and N and having a second thickness; and heat treating the first semiconductor layer and the second semiconductor layer. The second thickness is less than the first thickness. T band gap energy of the second semiconductor layer is greater than a band gap energy of the first semiconductor layer. After the heat treating of the first semiconductor layer and the second semiconductor layer, the second semiconductor layer contains the p-type impurity by diffusion of the p-type impurity from the first semiconductor layer.

20 Claims, 9 Drawing Sheets

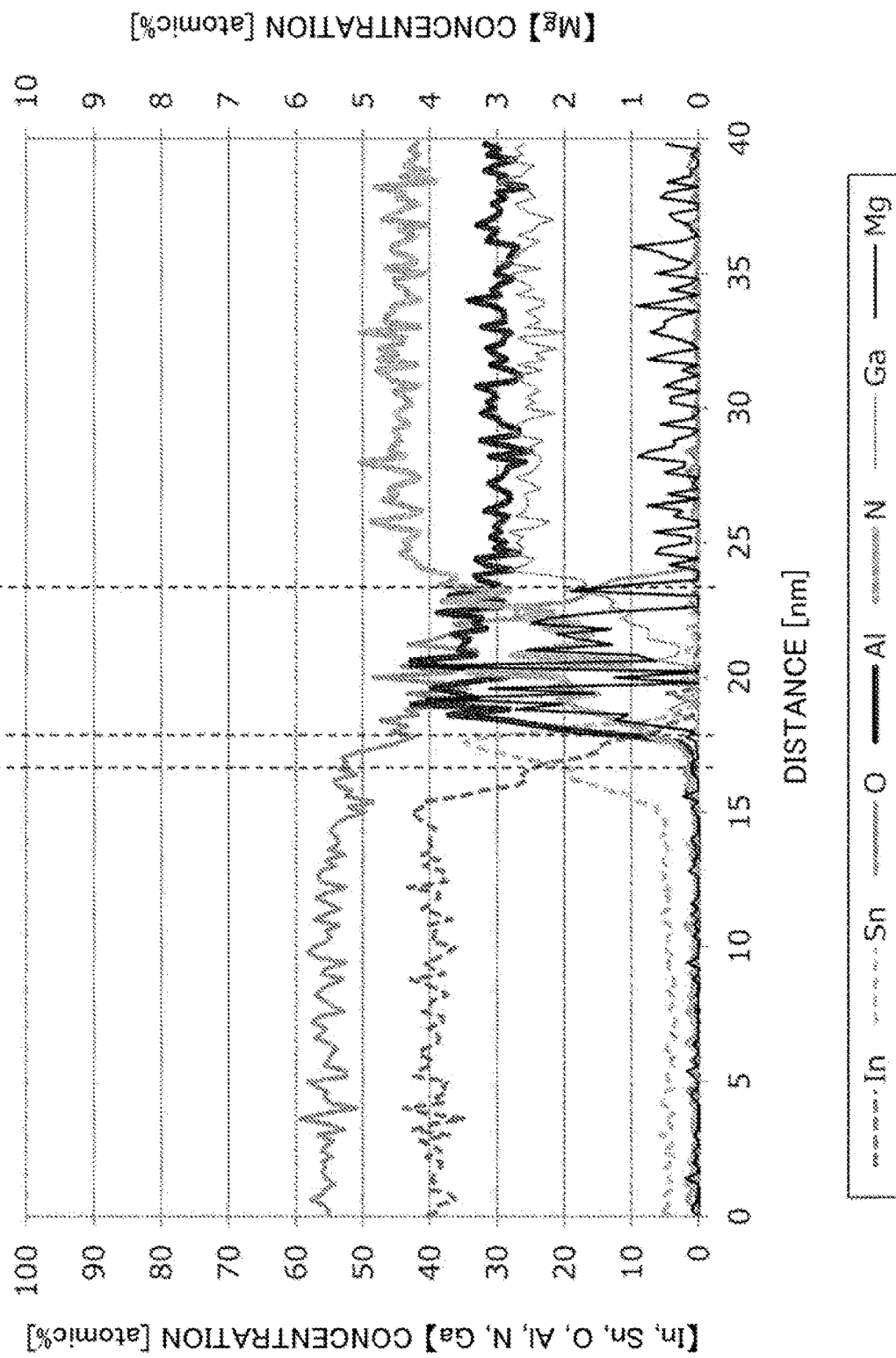

METHOD OF MANUFACTURING NITRIDE SEMICONDUCTOR DEVICE

CROSS-REFERENCE TO RELATED APPLICATION

The present application is based on and claims priority to Japanese Patent Application No. 2019-230440, filed on Dec. 20, 2019, the entire contents of which are hereby incorporated herein by reference.

BACKGROUND

The present disclosure relates to a method of manufacturing a nitride semiconductor device.

Nitride semiconductor devices such as light emitting diodes (LEDs) formed using nitride semiconductors are widely used. The nitride semiconductor devices are manufactured, for example, by growing a plurality of nitride semiconductor layers including an n-type nitride semiconductor layer, a light emitting layer, and a p-type nitride semiconductor layer on a sapphire substrate. In such a nitride semiconductor device, a nitride semiconductor in which Si is doped is used as an n-type nitride semiconductor, and a nitride semiconductor in which Mg is doped is used as a p-type nitride semiconductor layer as described in Japanese Patent Publication No. 2005-317931.

In nitride semiconductors, the activation rate of Mg is likely to be lower than the activation rate of Si, and in p-type nitride semiconductors, the hole concentration is likely to decrease as the band gap energy increases. In a nitride semiconductor light emitting device having a short emission wavelength such as that corresponding to deep ultraviolet light, for example, AlGaN is used as a light emitting layer, and a semiconductor layer having a wider bandgap energy than the light emitting layer, that is, a semiconductor layer having a higher Al composition ratio is suitable to use as a p-type semiconductor layer. However, in the p-type contact layer in contact with the p-electrode, a nitride semiconductor in which the band gap energy is relatively narrow, that is, the Al composition ratio is relatively small, is used to increase the hole concentration, as disclosed in Japanese Publication No. 2017-139252.

SUMMARY

In nitride semiconductor devices, a p-type formation of semiconductor layers having relatively high Al composition ratios is desired. For example, when an AlGaN layer having a relatively high Al composition ratio of 60% or more is formed by doping Mg by the MOCVD method, the AlGaN layer may exhibit n-type conductivity rather than p-type conductivity. The larger the composition of Al in the semiconductor layer, the more likely the crystallinity is to deteriorate, thereby increasing the number of nitrogen vacancies. For this reason, when p-type impurities are doped to a semiconductor layer with a relatively high Al composition ratio, n-type conductivity may be observed. If the p-type layer is not formed at the location where the p-type layer is to be formed, the nitride semiconductor device may not be driven, or the drive voltage may be high.

According to an embodiment, there is provided a method of manufacturing a nitride semiconductor. In the method, a first semiconductor layer containing Al, Ga, and N and having a first thickness by doping a p-type impurity is formed. A second semiconductor layer is formed over the first semiconductor layer without doping an n-type impurity and without doping a p-type impurity. The second semiconductor layer contains Al and N and having a second thickness. The first semiconductor layer and the second semiconductor layer are heat treated. The second thickness is less than the first thickness. A band gap energy of the second semiconductor layer is greater than a band gap energy of the first semiconductor layer. After the heat treating of the first semiconductor layer and the second semiconductor layer, the second semiconductor layer contains the p-type impurity by diffusion of the p-type impurity from the first semiconductor layer.

Additional objects and advantages of the embodiments are set forth in part in the description that follows, and in part will become obvious from the description, or may be learned by practice of certain embodiments of the invention. The objects and advantages of certain embodiments of the invention may be realized and attained by the elements and combinations particularly pointed out in the appended claims. It is to be understood that both the foregoing general description and the following detailed description are exemplary and explanatory and are not restrictive of the claimed embodiments of the invention.

BRIEF DESCRIPTION OF THE DRAWINGS

FIG. 4B is a concentration profile in a depth direction of a heat-treated sample B.

DETAILED DESCRIPTION

Hereinafter, a nitride semiconductor device according to an embodiment of the present disclosure will be described with reference to the drawings. However, the embodiments described below are for embodying the technical ideas of the present disclosure, and are not intended to limit the present disclosure. Because the drawings referred to in the following description schematically illustrate embodiments of the present disclosure, the scale, spacing, and positional relationship and the like of each member may be exaggerated, or a part of a member may be omitted.

A method of manufacturing a nitride semiconductor device of this embodiment includes steps of: forming a first semiconductor layer; forming a second semiconductor layer; and heat treating the first semiconductor layer and the second semiconductor layer.

In the first semiconductor layer forming step, a p-type impurity is doped to form a first semiconductor layer containing Al (aluminum), Ga (gallium), and N (nitrogen) at a first thickness. In the second semiconductor layer forming step, a second semiconductor layer containing Al and N is formed on the first semiconductor layer with a second thickness without doping n-type and p-type impurities. The second thickness is less than the first thickness. The band gap energy of the second semiconductor layer is greater than the band gap energy of the first semiconductor layer. After the heat treating step, the second semiconductor layer contains the aforementioned p-type impurity diffused from the first semiconductor layer.

By including the steps described above, the second semiconductor layer having a greater band gap energy than that of the first semiconductor layer can be turned into a p-type semiconductor. This allows the nitride semiconductor device containing the second semiconductor layer to be driven and the drive voltage of the semiconductor device to be reduced. One possible reason for this effect is that the crystallinity of the second semiconductor layer can be improved by purposefully not doping impurities. That is, the number of nitrogen vacancies can be reduced. The fewer the nitrogen vacancies, the less likely the semiconductor layer is to have n-type conductivity. Thus, p-type formation is likely to occur. In addition, because the second semiconductor layer is thinner than the first semiconductor layer, the p-type impurity is more likely to diffuse at a relatively high concentration in the second semiconductor layer.

Figure 1A:
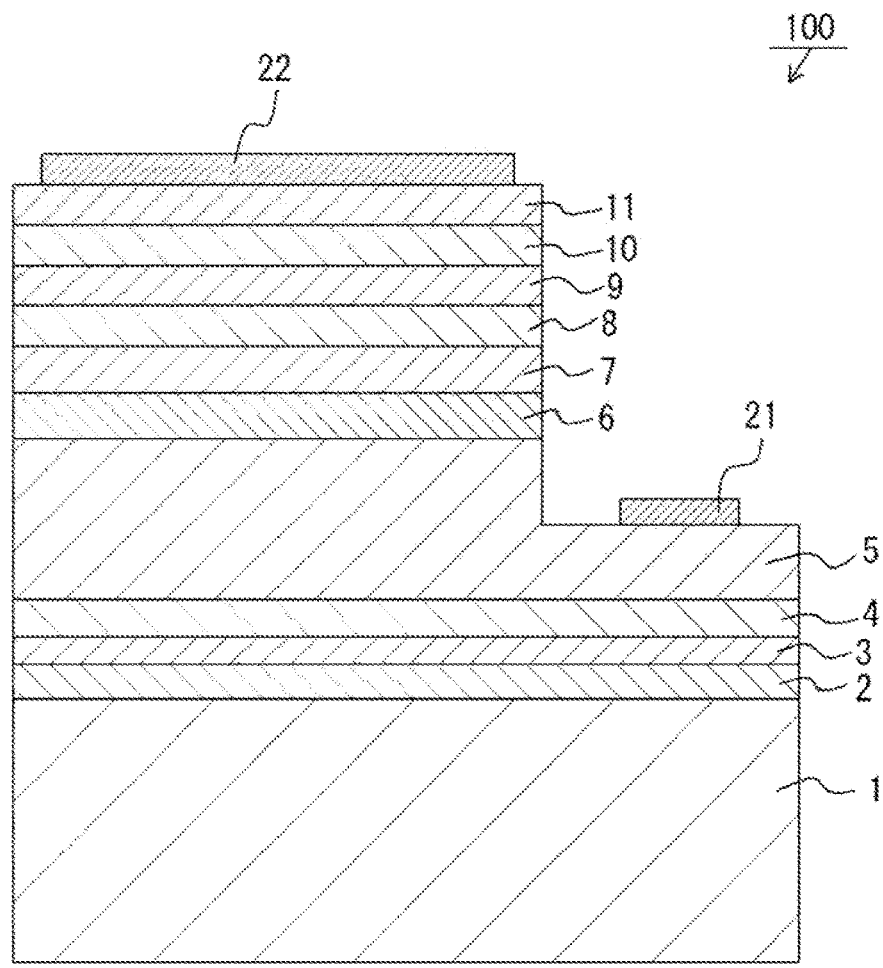
FIG. 1A is a schematic cross-sectional view of a nitride semiconductor device according to an embodiment of the present disclosure.

An example of a nitride semiconductor device obtained through the above-described manufacturing process is shown in FIG. 1A. FIG. 1A is a schematic cross-sectional view of a nitride semiconductor device 100 that is a nitride semiconductor light emitting device. The nitride semiconductor device 100 includes a substrate 1, a buffer layer 2, a superlattice layer 3, an undoped layer 4, an n-side contact layer 5 (n-type semiconductor layer), a light emitting layer 6, a p-side cladding layer 7, a composition gradient layer 8, a first semiconductor layer 9, a second semiconductor layer 10, a tin oxide layer 11, an n-electrode 21, and a p-electrode 22. The n-electrode 21 is provided on the n-side contact layer 5, and the p-electrode 22 is provided on the tin oxide layer 11. The nitride semiconductor device 100 shown in FIG. 1A is a nitride semiconductor light emitter configured to emit deep ultraviolet light.

Figure 2:
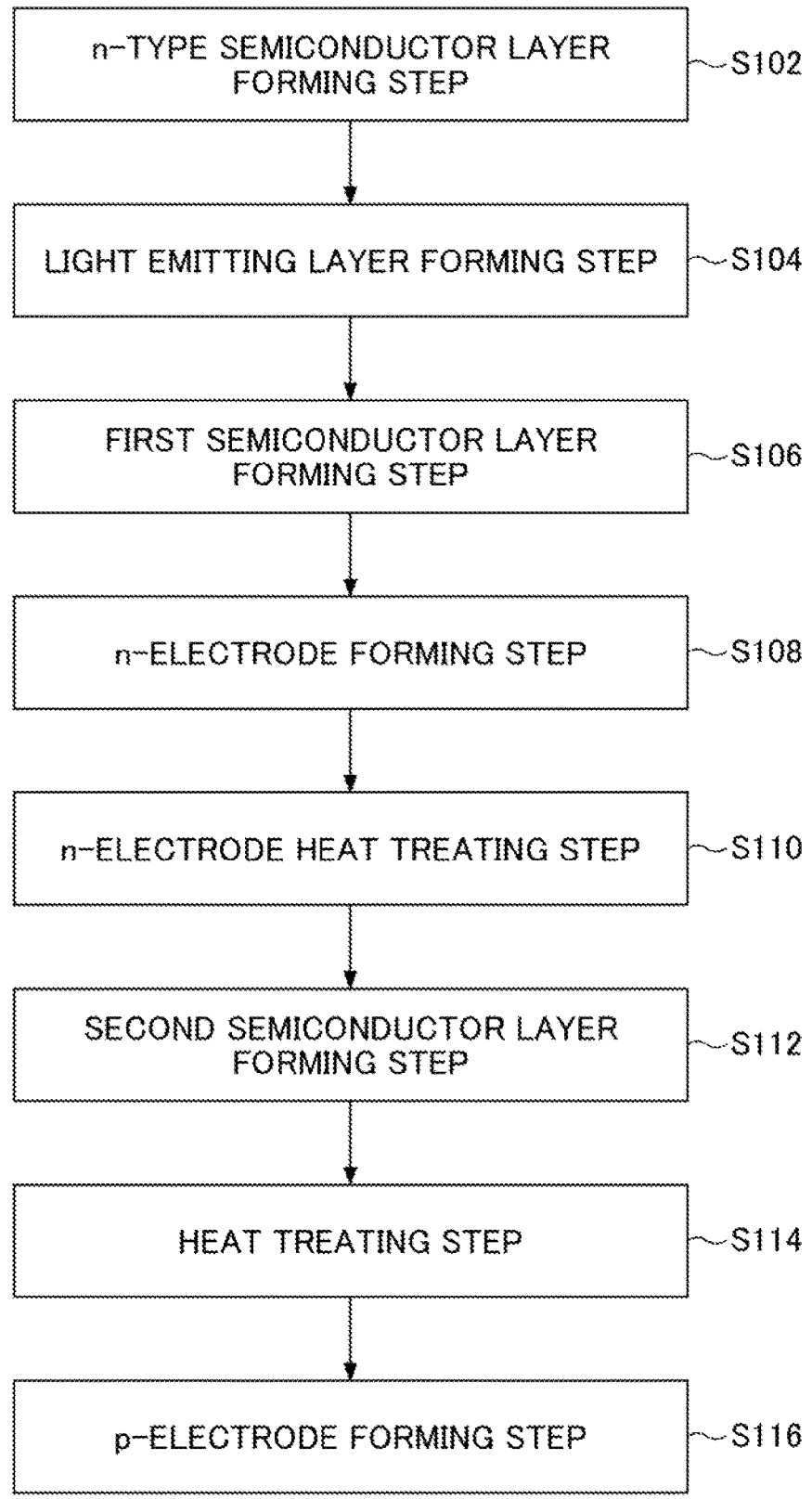
FIG. 2 is a process flow of a method of manufacturing a nitride semiconductor device according to an embodiment of the present disclosure.

A method for manufacturing a nitride semiconductor device 100 is shown in FIG. 2. FIG. 2 is a process flow of a method of manufacturing a nitride semiconductor device 100. The manufacturing method includes an n-type semiconductor layer forming step S102, a light emitting layer forming step S104, a first semiconductor layer forming step S106, an n-electrode forming step S108, an n-electrode heat treating step S110, a second semiconductor layer forming step S112, a heat treating step S114, and a p-electrode forming step S116.

Hereinafter, each step will be described in detail with reference to FIGS. 1A to 3J.

(Substrate Preparation Process)

Figure 3A:
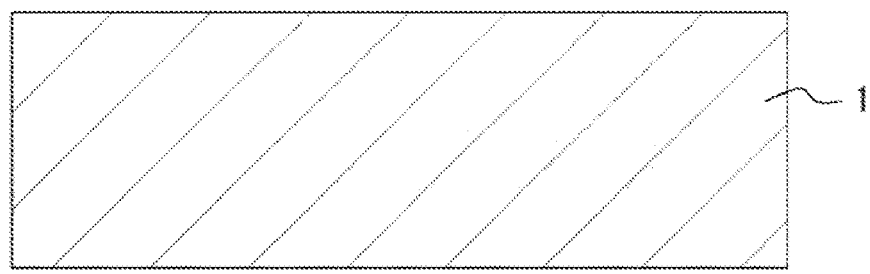
FIG. 3A is a schematic cross-sectional view illustrating a step of a method of manufacturing a nitride semiconductor light emitting device.

As shown in FIG. 3A, the substrate 1 may be prepared before the n-type semiconductor layer forming step S102. As the substrate 1, an insulating substrate such as a spinel ($MgAl_2O_4$) or the like can be used in addition to C-plane, R-plane, and A-plane of the sapphire, and a semiconductor substrate such as SiC, ZnS, ZnO, GaAs, GaN, and AlN can be used.

(Buffer Layer and the Like Forming Process)

Figure 3B:
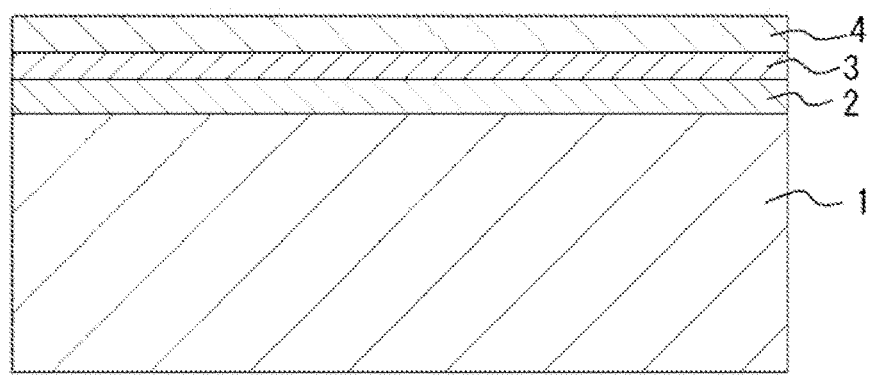
FIG. 3B is a schematic cross-sectional view illustrating a step of the method of manufacturing the nitride semiconductor light emitting device.

As shown in FIG. 3B, a step of forming other layers, such as a buffer layer 2, may be performed after the substrate preparation step and before the n-type semiconductor layer forming step S102. In the nitride semiconductor device 100 shown in FIG. 1A, the buffer layer 2, a superlattice layer 3, and an undoped layer 4 are first formed on the surface of the substrate 1 in this order. The buffer layer 2 and the superlattice layer 3 are layers that mitigate stress caused by strain due to differences in lattice constant and the like between the substrate 1 and the n-nitride semiconductor layer. First, a buffer layer 2 is formed on the substrate 1, then a superlattice layer 3 is formed on the buffer layer 2, and then an undoped layer 4 is formed on the superlattice layer 3. As the buffer layer 2, a layer made of, for example, AlN can be used. As the superlattice layer 3, a structure that repeats the AlGaN layer and the AlN layer multiple times can be used, for example. The undoped layer 4 is a pit embedded layer to reduce the pit generated in the superlattice layer 3. The undoped layer 4 may be, for example, an AlGaN layer. The undoped layer 4 is formed to be, for example, 3 µm thick. Each semiconductor layer formed on the substrate 1 can be formed, for example, by a metalorganic chemical vapor deposition (MOCVD) process. Some of the layers may be formed by different growth methods than others. For example, the buffer layer 2 may be formed by sputtering, and the superlattice layer 3 and later formed layers may be formed by the MOCVD method.

(N-Type Semiconductor Layer Forming Step S102)

Figure 3C:
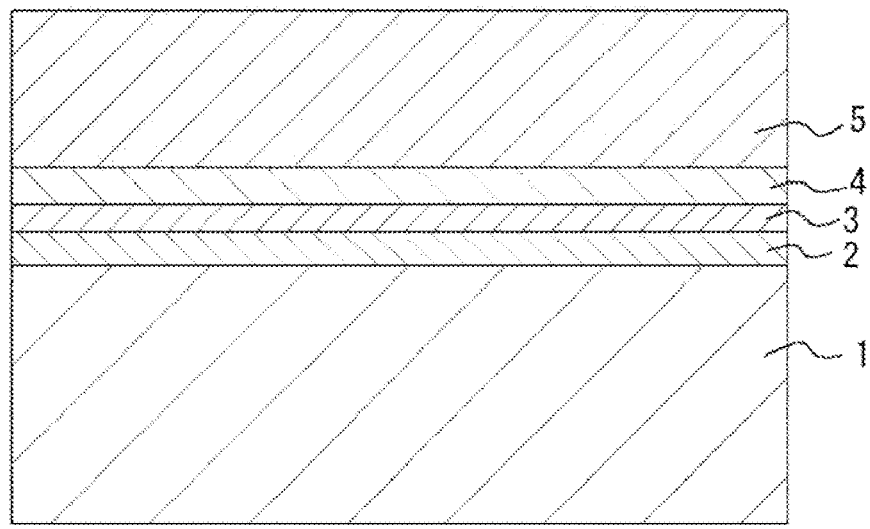
FIG. 3C is a schematic cross-sectional view illustrating a step of the method of manufacturing the nitride semiconductor light emitting device.

In step S102, an n-type impurity is doped to form an n-type semiconductor layer. The n-type semiconductor layer may be provided over the substrate 1. In this embodiment, as shown in FIG. 3C, the n-side contact layer 5 is formed as an n-type semiconductor layer. The n-side contact layer 5 is an AlGaN layer containing Al, Ga, and N. The content ratio of Al to Ga may be adjusted while considering other configurations so that the nitride semiconductor light emitting device can emit light in the deep ultraviolet wavelength range. In order to inhibit the self-absorption of the AlGaN layer and to increase the light extraction efficiency, the Al content ratio in the AlGaN layer to Ga is preferably high. In particular, the n-side contact layer 5 is preferably an $Al_aGa_{1-a}N$ ($0.5 \leq a < 1$) layer.

(Light Emitting Layer Forming Step S104)

Figure 3D:
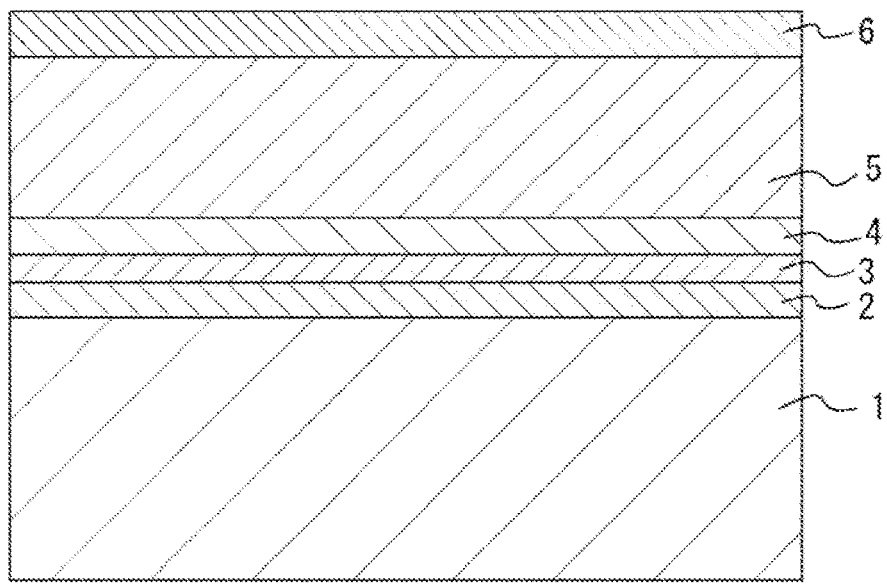
FIG. 3D is a schematic cross-sectional view illustrating a step of the method of manufacturing the nitride semiconductor light emitting device.

In step S104, a light emitting layer 6 is formed on the n-type semiconductor layer. The n-type semiconductor layer may be in contact with the light emitting layer 6, or another layer may be disposed therebetween. In this embodiment, the light emitting layer 6 is formed on the n-side contact layer 5, as shown in FIG. 3D. The light emitting layer 6 comprises, for example, a multi-quantum well structure in which the well layers and the barrier layers are alternately and repeatedly stacked. Preferably, the light emitting layer 6 is a layer configured to emit deep ultraviolet light. Deep ultraviolet light refers to light with a peak wavelength of 220 to 350 nm. By using the second semiconductor layer 10 having the composition ratio of Al greater than that of the first semiconductor layer 9, the absorption rate for deep ultraviolet light can be reduced, and thus the light emission efficiency of the obtained nitride semiconductor light emitting device can be improved.

The well and barrier layers in the light emitting layer 6 contains an AlGaN layer whose composition is controlled, for example, in response to light of a desired emission wavelength. The well and barrier layers of the light emitting layer 6 can be comprised, for example, of Group III nitrides represented by the general formula $In_bAl_cGa_{1-b-c}N$ ($0 \leq b \leq 0.1$, $0.4 \leq c \leq 1.0$, $b+c<1.0$). The composition of the well layer and barrier layer of the light emitting layer 6 is selected such that the band gap energy of the barrier layer is greater than the band gap energy of the well layer. In order to obtain a nitride semiconductor light emitting device that emits deep ultraviolet light with a peak wavelength of 280 nm, for example, a well layer may be composed of an $Al_{0.45}Ga_{0.55}N$ nitride semiconductor having an Al composition ratio c of 0.45. In that case, the barrier layer may be composed of a nitride semiconductor composed of $Al_{0.56}Ga_{0.44}N$ having an Al composition ratio c of 0.56.

(P-Side Cladding Layer and the Like Forming Process)

Figure 3E:
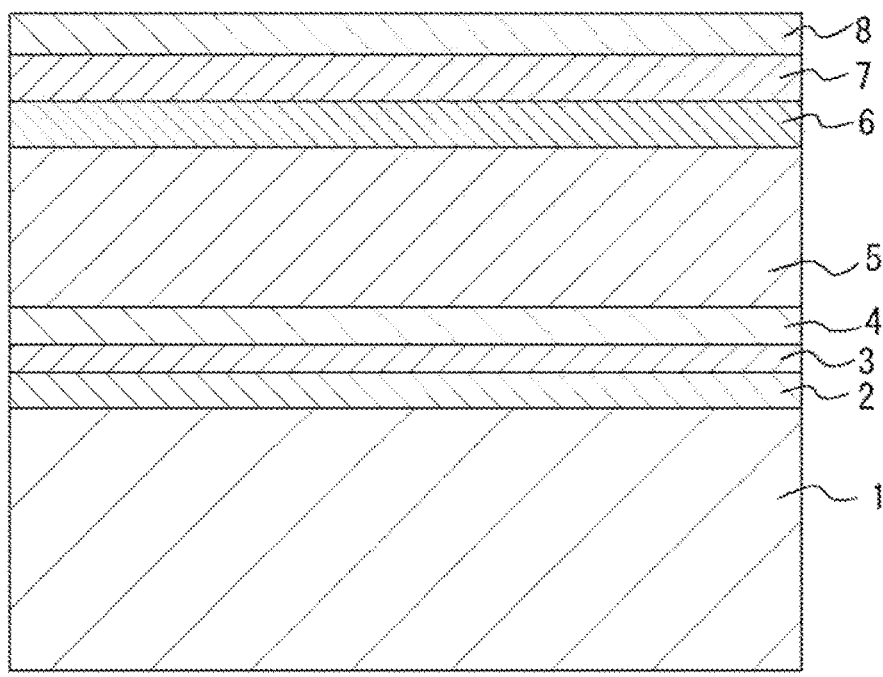
FIG. 3E is a schematic cross-sectional view illustrating a step of the method of manufacturing the nitride semiconductor light emitting device.

The step of forming other layers comprising the p-side semiconductor layer may be included after the light emitting layer forming step S104 and before the first semiconductor layer forming step S106. In this embodiment, as shown in FIG. 3E, after the light emitting layer 6 is formed, the p-side cladding layer 7 and the composition gradient layer 8 are formed in this order. The p-side cladding layer 7 is a p-side barrier layer that blocks electrons. The p-side cladding layer 7 is an AlGaN layer to which a p-type impurity such as Mg is doped. The Al composition ratio of the p-side cladding layer 7 can be greater than the Al composition ratio of the first semiconductor layer. For example, the thickness of the p-side cladding layer 7 may be 10 nm or more and 30 nm or less. The composition gradient layer 8 is an $Al_dGa_{1-d}N$ ($0 \leq d < 1$) layer to which a p-type impurity such as Mg is doped. The thickness of the composition gradient layer 8 may be, for example, 20 nm or more and 60 nm or less.

(First Semiconductor Layer Forming Step S106)

Figure 3F:
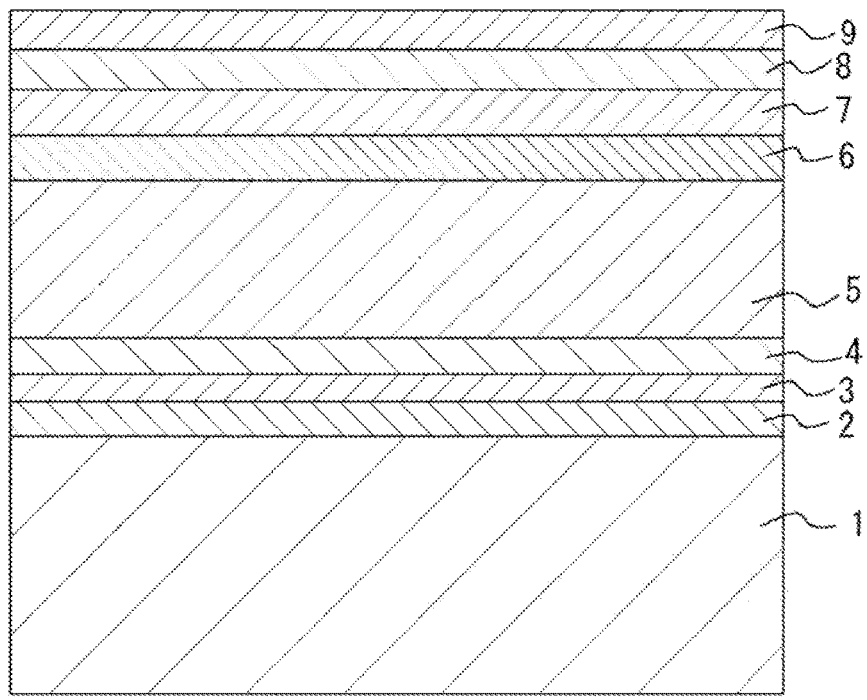
FIG. 3F is a schematic cross-sectional view illustrating a step of the method of manufacturing the nitride semiconductor light emitting device.

In step S106, the first semiconductor layer 9 is formed. As shown in FIG. 3F, the first semiconductor layer 9 is formed over the light emitting layer 6. The light emitting layer 6 and the first semiconductor layer 9 may be in contact with each other, or the p-side cladding layer 7 described above may be disposed therebetween. The first semiconductor layer 9 is formed by doping p-type impurities, and contains Al, Ga and N. Layers containing Al, Ga, and N include nitride semiconductor layers containing Al and Ga, such as an AlGaN layer or an AlInGaN layer. When the first semiconductor layer 9 is an $Al_xGa_{1-x}N$ layer, the composition ratio x of Al with respect to the first semiconductor layer 9 is 0.2 or more and 0.5 or less. The first semiconductor layer 9 may be formed, for example, by the MOCVD method. The thickness (first thickness) of the first semiconductor layer 9 is, for example, 30 nm or more and 600 nm or less. P-type impurities include Mg.

Preferably, the concentration of the p-type impurity doped to the first semiconductor layer 9 is lower than that used for the normal p-type contact layer. This is because the crystallinity of the first semiconductor layer can be improved by lowering the concentration of the doped p-type impurity, and thus the crystallinity of the next formed second semiconductor layer can be improved. The concentration of the p-type impurity doped to the first semiconductor layer 9 is less than $1 \times 10^{20}$ cm$^{-3}$, and preferably $6 \times 10^{19}$ cm$^{-3}$ or less. More preferably, the concentration of the p-type impurity to be doped to the first semiconductor layer 9 is not less than $2 \times 10^{19}$ cm$^{-3}$ and not more than $6 \times 10^{19}$ cm$^{-3}$.

(N-Electrode Forming Step S108)

Figure 3G:
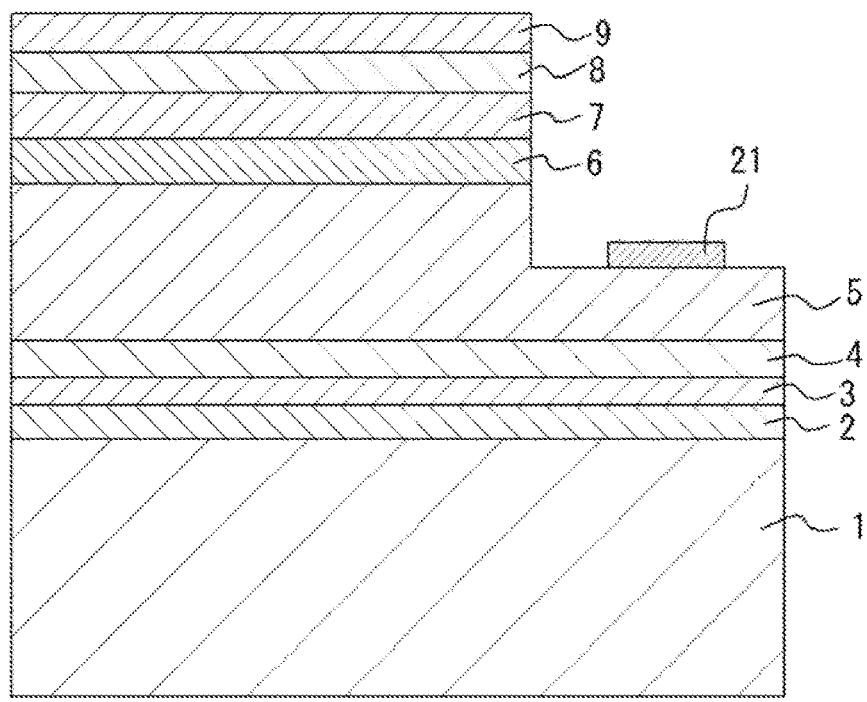
FIG. 3G is a schematic cross-sectional view illustrating a step of the method of manufacturing the nitride semiconductor light emitting device.

In step S108, an n-electrode 21 is formed that is electrically connected to the n-type semiconductor layer. In this embodiment, a part of the previously formed semiconductor layer is first removed to expose a part of the n-type semiconductor layer. Such partial removal can be accomplished, for example, by forming a mask having a predetermined shape on the surface of the previously formed semiconductor layer and etching off the semiconductor layer. Then, as shown in FIG. 3G, the n-electrode 21 is formed on the exposed surface of the n-type semiconductor layer. In this embodiment, the n-electrode forming step S108 is performed after the first semiconductor layer forming step S106 and before the second semiconductor layer forming step S112. The n-electrode forming step S108 may be performed after the second semiconductor layer forming step S112.

The n-electrode 21 includes, for example, a Ti layer, an Al alloy layer containing Si, a layer containing one or more Ta and W layers, and a layer containing one or more Ti and Ru layers, starting from the n-side contact layer 5. The n-electrode 21 may be formed, for example, by vapor deposition or sputtering.

(N-Electrode Heat Treating Step S110)

In step S110, the n-electrode 21 is heat treated. This allows the n-electrode 21 to be ohmically connected to the n-type semiconductor layer. The n-electrode heat treating step S110 is preferably performed before the p-electrode forming step S116 and may be performed before the second semiconductor layer forming step S112. In particular, when the Mg layer is used as the p-electrode 22, the melting point of the Mg is relatively low, and the n-electrode heat treating step S110 may be solidified with another metal layer. Therefore, the n-electrode 21 is preferably heat treated in this order. The temperature of heat treatment in the n-electrode heat treating step S110 is higher than the temperature of heat treatment in the heat treating step S114, which will be described later. The temperature of the heat treatment may be, for example, not less than 600 degrees C. but not more than 1000 degrees C. The retention time of such heat treatment temperatures may range from 1 to 60 minutes. Heat treatment of the n-electrode 21 is performed, for example, by holding the temperature at 800 degrees C. for 1 minute in an $N_2$ atmosphere. The temperature of the heat treatment of the n-electrode 21 refers to the temperature of the tray of the RTA (Rapid Thermal Annealing) device. If the device used for the heat treatment is another device such as an electric furnace, a temperature and retention time that obtain the same effect can be used.

(Second Semiconductor Layer Forming Step S112)

Figure 3H:
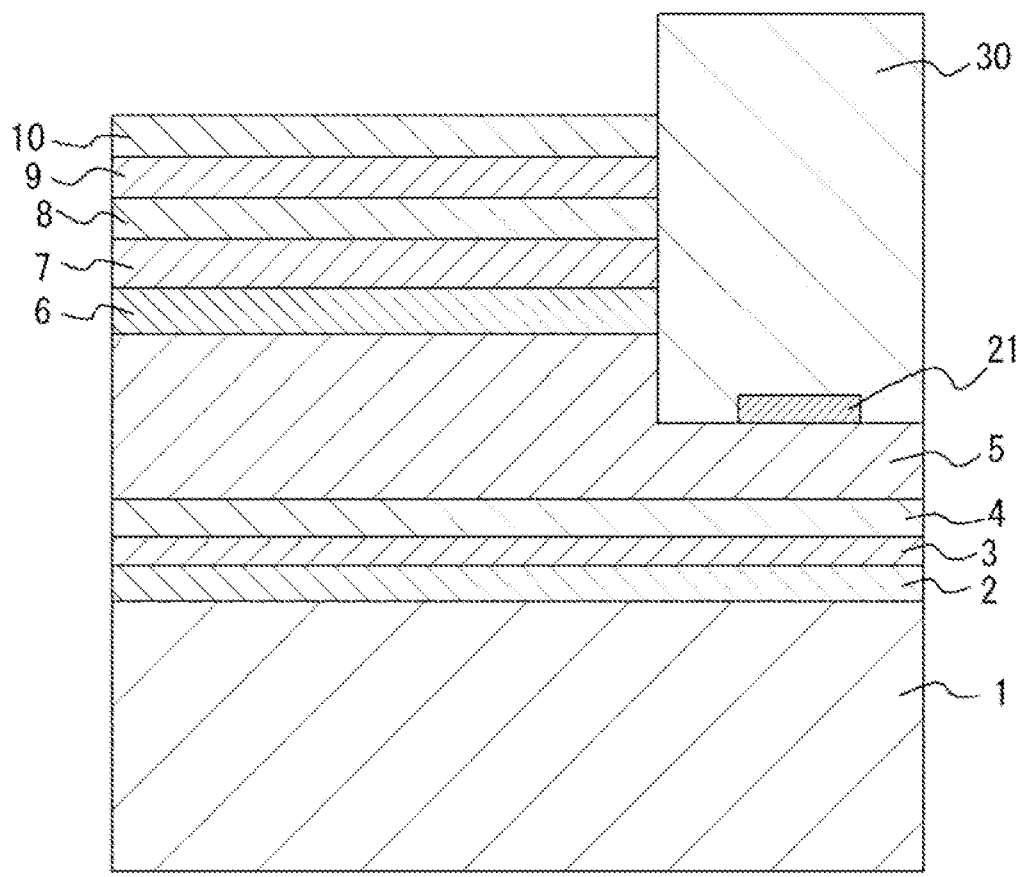
FIG. 3H is a schematic cross-sectional view illustrating a step of the method of manufacturing the nitride semiconductor light emitting device.

In step S112, a second semiconductor layer 10 is formed. The second semiconductor layer 10 is positioned close to the first semiconductor layer 9 so that the p-type impurity can be moved from the first semiconductor layer 9. As shown in FIG. 3H, the second semiconductor layer 10 is preferably formed in contact with the top surface of the first semiconductor layer 9. Accordingly, the p-type impurity can be efficiently transferred from the first semiconductor layer 9 to the second semiconductor layer 10.

The second semiconductor layer 10 contains Al and N. The second semiconductor layer 10 may be, for example, an AlInGaN layer, an AlGaN layer, an AlN layer, or an AlON layer. The band gap energy of the second semiconductor layer 10 is greater than the band gap energy of the first semiconductor layer 9. When the first semiconductor layer 9 is an $Al_xGa_{1-x}N$ layer and the second semiconductor layer 10 is an $Al_yGa_{1-y}N$ layer, the relationship between the composition ratio x of Al in the first semiconductor layer 9 and the composition ratio y of Al in the second semiconductor layer 10 is assumed to be $x<y\leq1$. When the composition ratio y of Al is 0, the second semiconductor layer 10 is AlN. As will be described later, AlN may be formed by oxidizing AlN. The difference between the composition ratio x of Al with respect to the first semiconductor layer 9 and the composition ratio y of Al with respect to the second semiconductor layer 10 can be, for example, 0.8 or more. This difference may be 0.2 or less. When forming the second semiconductor layer 10 as a part of the nitride semiconductor light emitting device that emits deep ultraviolet light, the transmittance of the light emitting layer 6 to the deep ultraviolet light is higher than that of the first semiconductor layer 9. These transmittance differences may be, for example, 3% or more, 5% or more, or 20% or less.

The second semiconductor layer 10 is preferably formed by sputtering. This allows the p-type impurity to diffuse from the first semiconductor layer 9 to the second semiconductor layer 10. In addition, when the second semiconductor layer 10 is formed after the n-electrode heat treating step S110, the second semiconductor layer 10 is not formed where the second semiconductor layer 10 is not required, such as on the upper surface of the n-electrode 21. In this embodiment, as shown in FIG. 3H, regions other than the top of the first semiconductor layer 9 are covered with a mask member 30 such as a resist to form the second semiconductor layer 10. For the formation of the second semiconductor layer 10, because the material used for the mask member 30, such as a resist, may have a low heat resistance temperature, it is suitable to use sputtering, which allows deposition of a film at a lower temperature than the MOCVD process. For example, the first semiconductor layer 9 and the layers below the first semiconductor layer 9 may be formed by the MOCVD process, followed by sputtering of the second semiconductor layer 10. The sputtering temperature may be 25 degrees C. or more and 200 degrees C. or less, and may be, for example, room temperature. When the second semiconductor layer 10 is formed by sputtering, one or more targets including Al and N are used. For example, the second semiconductor layer 10 is formed using an AlN target or using an Al target and an N target. In this case, the second semiconductor layer 10 may be an AlN layer or an AlON layer. Even if only the target of Al and the target of N are used to form the second semiconductor layer 10, the AlON layer may be formed during and/or after formation as oxidation progresses. When the AlON layer is formed by oxidation, for example, the O (oxygen) content may increase toward the top surface, while the N (nitrogen) content may decrease toward the top surface. In order to reduce oxidation of the second semiconductor layer 10, sputtering of the second semiconductor layer 10 is preferably performed in an atmosphere other than an oxidizing atmosphere or in a vacuum. The purity of the target used for sputtering may be, for example, 99% or more, as long as a film of the desired composition can be formed.

The thickness (the second thickness) of the second semiconductor layer 10 may be 1 nm or more and 20 nm or less. The thickness of the second semiconductor layer 10 may be, for example, 3 nm or 5 nm. The difference between the thickness of the first semiconductor layer 9 and the thickness of the second semiconductor layer 10 may be, for example, 10 nm or more. This difference may be 500 nm or less.

(Tin Oxide Layer Forming Step)

Figure 1B:
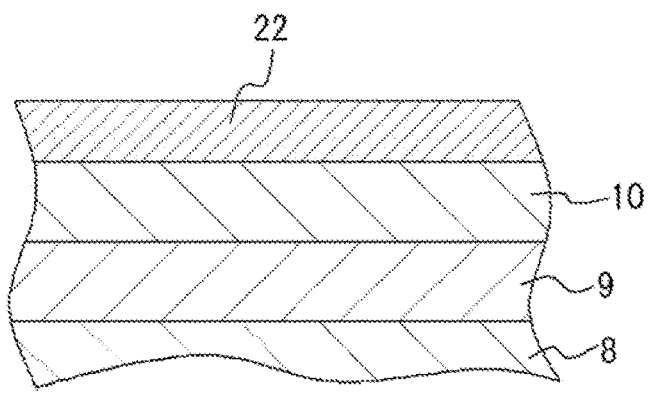
FIG. 1B is a schematic cross-sectional view illustrating an enlarged part of a nitride semiconductor device of another embodiment according to the present disclosure.
Figure 3I:
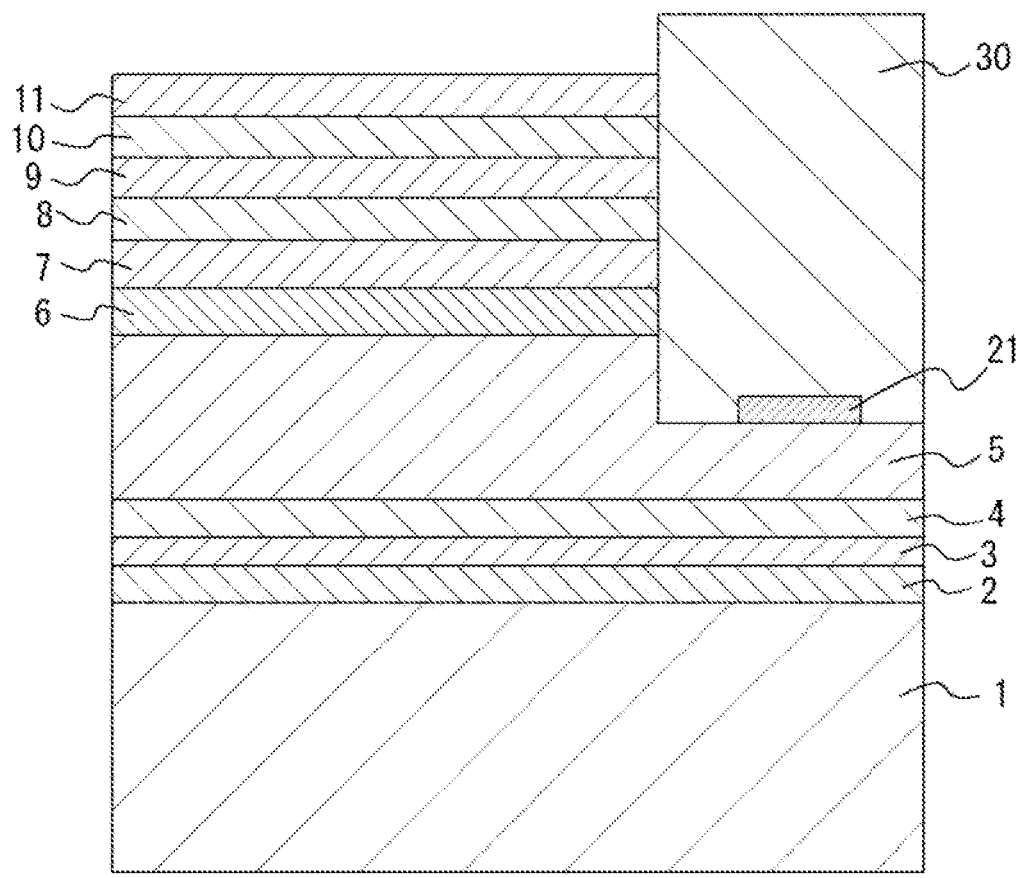
FIG. 3I is a schematic cross-sectional view illustrating a step of the method of manufacturing the nitride semiconductor light emitting device.

The second semiconductor layer forming step S112 may be performed after a step of forming a tin oxide layer 11 and before the heat treating step S114. As shown in FIG. 3I, the tin oxide layer 11 is formed on the second semiconductor layer 10. The tin oxide layer 11 may be a SnO layer or a $SnO_2$ layer. The tin oxide layer 11 is formed, for example, by sputtering. By forming the tin oxide layer 11, it is considered that oxidation of the second semiconductor layer 10 is inhibited compared to the case in which the second semiconductor layer 10 is exposed without forming the tin oxide layer 11. Materials other than tin oxide may be used for the layer formed on the second semiconductor layer 10. The thickness of the tin oxide layer 11 may be, for example, 1 nm or more and 20 nm or less. The thickness of the tin oxide layer 11 may be greater than, for example, the thickness of the second semiconductor layer 10. When forming the tin oxide layer 11, a p-electrode 22 can be contacted with the tin oxide layer 11. In order to further reduce absorption of deep ultraviolet light, it is preferable to contact the p-electrode 22 with the second semiconductor layer 10 without forming the tin oxide layer 11, as shown in FIG. 1B.

(Heat Treating Step S114)

In step S114, at least the first semiconductor layer 9 and the second semiconductor layer 10 are heat treated (annealed). Only the first semiconductor layer 9 and the second semiconductor layer 10 need not be selectively heat treated, and the other layers may be simultaneously heat-treated. In this embodiment, the substrate 1 and all of the layers formed thereon are heat treated. Heat treating can achieve low resistance of the second semiconductor layer 10. This may be because the p-type impurity contained in the first semiconductor layer 9 diffuses into the second semiconductor layer 10 and/or the p-type impurity contained in the second semiconductor layer 10 is activated. In addition, when the second semiconductor layer 10 is formed by sputtering, the effect of getting closer the crystal orientation uniformly in the plane can be obtained by performing the heat treating step S114. When the second semiconductor layer 10 is sputtered, the crystal orientation variation in the plane is likely to be greater than when the second semiconductor layer 10 is sputtered by the MOCVD method. However, such variation can be reduced by performing the heat treating step S114. If the crystal orientation of the second semiconductor layer 10 is highly variable, the second semiconductor layer 10 might be removed by an alkaline solution used in patterning the p-electrode 22, but this possibility can be reduced by performing the heat treating step S114.

The second semiconductor layer 10 that undergoes the heat treating step S114 contains a p-type impurity. Because the second semiconductor layer 10 is formed without doping the p-type impurity, that is the indication that the p-type impurity diffused from the first semiconductor layer 9. As described above, when the second semiconductor layer 10 is formed by sputtering, a p-type impurity may be already included in the second semiconductor layer 10 prior to the heat treatment step S114. Also, in this case, that is the indication that the second semiconductor layer 10 after the heat treatment step S114 contains the p-type impurity diffused from the first semiconductor layer 9.

The temperature of the heat treatment may be 400 degrees C. or higher and 500 degrees C. or higher. Preferably, the temperature of the heat treatment is 600 degrees C. or higher, and more preferably 700 degrees C. or higher. The temperature of heat treatment refers to the temperature held for a certain period of time. That is, in heat treatment, the temperature is raised to such a temperature, the temperature is maintained at the temperature for a certain period of time, and then the temperature is lowered. When the heat treatment is carried out using the same apparatus as the previous process or the subsequent process, warming and cooling may be omitted. The temperature at which heat treating is performed is not more than the temperature at which the layer to be treated decomposes. The temperature of the heat treatment may be, for example, 400 degrees C. to 900 degrees C., 400 degrees C. to 800 degrees C., 500 degrees C. to 800 degrees C., or 600 degrees C. to 800 degrees C. Preferably, the temperature of the heat treatment is lower than the temperature of the n-electrode heat treating step S110. This is because, as described above, the temperature of the heat treatment of the n-electrode 21 is likely to be relatively high and is preferably lower in order to inhibit oxidation of the second semiconductor layer 10. These temperature differences may be, for example, 10 degrees C. or higher, 50 degrees C. or higher, 300 degrees C. or lower, or 200 degrees C. or lower. The retention time of the temperature of the heat treatment may be more than 1 minute, and may be more than 30 minutes. The retention time of the temperature of the heat treatment may be 60 minutes or less. The temperature of the aforementioned heat treatment refers to the temperature of the atmosphere in the electric furnace. If the device used for the heat treatment is another device such as RTA device, a temperature and retention time that obtain the same effect can be used.

The heat treatment can be carried out in an atmosphere other than an oxidation atmosphere or in a vacuum. If the heat treatment is performed in the oxidation atmosphere, the oxidation of the second semiconductor layer 10 may be promoted. Therefore, the oxidation atmosphere is preferably avoided. Examples of the non-oxidation atmosphere include an atmosphere in which oxidation is not substantially promoted, such as a nitrogen atmosphere or a reduction atmosphere. When the heat treatment is performed in a vacuum, the pressure may be, for example, 10 kPa or less, preferably 1 kPa or less, and more preferably 100 Pa or less.

(P-Electrode Forming Step S116)

The second semiconductor layer forming step S112 may be followed by the step S116 of forming the p-electrode 22. As shown in FIG. 1A, the p-electrode 22 is formed against the top surface of the tin oxide layer 11. As shown in FIG. 1B, the p-electrode 22 may be formed in contact with the top surface of the second semiconductor layer 10. The p-electrode 22 may be made of a metallic material such as Mg, Ti, Ru, Ni, or a transparent conductive material such as ITO. The p-electrode 22 is formed, for example, by stacking the Mg, Ti, and Ru layers in this order. When the nitride semiconductor device 100 is a nitride semiconductor light emitting device that emits deep ultraviolet light, an Mg layer may be used as the reflective layer. The p-electrode 22 may be formed, for example, by evaporation or sputtering.

The heat treating step S114 may be performed after the second semiconductor layer forming step S112 and before the p-electrode forming step S116. When the Mg layer is used as the p-electrode 22, if the heat treatment step S114 is performed after the p-electrode 22 is formed, the Mg layer may be solidified with the other metal layer. Therefore, the heat treatment step S114 is preferably performed before the p-electrode forming step S116.

After forming the p-electrode 22, a heat treatment of the p-electrode 22 may be performed. When Mg is used for the p-electrode 22, for the reasons described above, the temperature of the heat treatment of the p-electrode 22 is preferably lower than the temperature of the heat treatment step S114. The difference between the temperature of the heat treatment of the p-electrode 22 and the temperature of the heat treatment step S114 can be 10 degrees C. or more, 50 degrees C. or more, 300 degrees C. or less, and 200 degrees C. or less. The temperature of the heat treatment of the p-electrode 22 refers to the temperature of the atmosphere in the furnace of the electric furnace. If the device used for heat treatment of the p-electrode is another device such as the RTA device, a temperature and retention time that obtain the same effect can be used.

By passing through the above steps, the nitride semiconductor device 100 shown in FIG. 1A can be obtained. Although one nitride semiconductor device 100 is shown in FIGS. 1A and 3A to 3I, the nitride semiconductor device 100 may be formed as one of a plurality of nitride semiconductor devices 100 that are formed on a single wafer and the nitride semiconductor device 100 may be obtained by separating the nitride semiconductor devices 100 along the scribes or the like.

The nitride semiconductor light emitting devices include light emitting diodes (LEDs) or laser diodes (LDs). Alternatively, although the nitride semiconductor device has been described above as a nitride semiconductor device, the nitride semiconductor device may be another device, such as a field effect transistor.

EXAMPLE

Example 1

A sapphire substrate is mounted in a MOCVD device as a substrate 1. A buffer layer 2, a superlattice layer 3, an n-side semiconductor layer (an undoped layer 4 composed of AlGaN), a n-side contact layer 5 composed of an $Al_{0.60}Ga_{0.40}N$ layer, a light emitting layer 6, a p-side cladding layer 7 composed of an Mg-doped $Al_{0.63}Ga_{0.37}N$ layer, a composition gradient layer 8 doped with Mg, where the composition is gradually changed from an $Al_{0.63}Ga_{0.37}N$ layer to GaN, and a first semiconductor layer 9 composed of an Mg-doped $Al_{0.50}Ga_{0.50}N$ layer, are grown on a sapphire substrate sequentially. The first semiconductor layer 9 is grown at a film thickness of 300 nm and a Mg concentration of $3.3 \times 10^{19}$ $cm^{-3}$.

Then, a mask member 30 having a predetermined shape was formed on the surface of the first semiconductor layer 9, and an n-side contact layer 5 was exposed by removing a portion from the first semiconductor layer 9 to part of the n-side contact layer 5 by etching.

The n-electrode 21 was then formed on the n-side contact layer 5 by sputtering. Specifically, a Ti layer (thickness: 25 nm), an Al alloy layer containing Si (thickness: 200 nm), a Ta layer (thickness: 400 nm), and a Ru layer (thickness: 50 nm) were sequentially formed from the n-side contact layer 5 side as the n-electrode 21. Thereafter, the n-electrode 21 was heat treated (in the $N_2$ atmosphere, at 800 degrees C. for 1 minute). In this specification, a thickness of a layer may be described in parentheses, for example, "the Ti layer (thickness: 25 nm)".

Then, the second semiconductor layer 10 was formed with a target thickness of 3 nm using an Al target and an N target in a mixed atmosphere of argon and nitrogen by sputtering. Then, by sputtering, a tin oxide layer 11 is formed with a target thickness of 5 nm by forming the film using the Sn target in a mixed atmosphere of argon and oxygen.

Subsequently, the substrate 1 formed up to the tin oxide layer 11 was installed in the electric furnace, and heat treatment was performed for 10 minutes at a temperature of 500 degrees C. in a vacuum.

The p-electrode 22 was then sputtered on the tin oxide layer 11. Specifically, first, the entire electrode including the Mg layer (thickness: 100 nm), the Ti layer (thickness: 100 nm), and the Ru layer (thickness: 30 nm) is formed as the p-electrode 22. Thereafter, the p-electrode 22 was heat treated (in a vacuum, at 400 degrees C. for 10 minutes).

A protective film (thickness: 700 nm) composed of $SiO_2$ was then applied to cover the surface of the buffer layer 2, the superlattice layer 3, the n-side semiconductor layer, the light emitting layer 6, the p-side semiconductor layer, and the p-electrode 22 except for a portion of the top surface of the n-electrode 21 and the p-electrode 22, that is, to cover substantially the entire surface of the nitride semiconductor device 100.

Then, An n-side eutectic pad is formed to cover a portion of the top surface of the n-electrode 21, and a p-side eutectic pad is formed to cover a portion of the top surface of the p-electrode 22. Specifically, the Ti layer (thickness: 200 nm), the Pt layer (thickness: 200 nm), and the Au layer (thickness: 500 nm) were formed sequentially from the sides of the n-electrode 21 and the p-electrode 22 as the n-side eutectic pad and the p-side eutectic pad.

Through the above manufacturing process, a nitride semiconductor light emitting device that emits deep ultraviolet light as the nitride semiconductor device 100 of Example 1 was manufactured.

The resulting nitride semiconductor light emitting device was subject to luminescence inspection. As the result, emission was confirmed at a forward current of 20 mA. The voltage at 20 mA was 9.6 V.

(Concentration Distribution of Each Element with and without Heat Treatment)

Figure 4A:
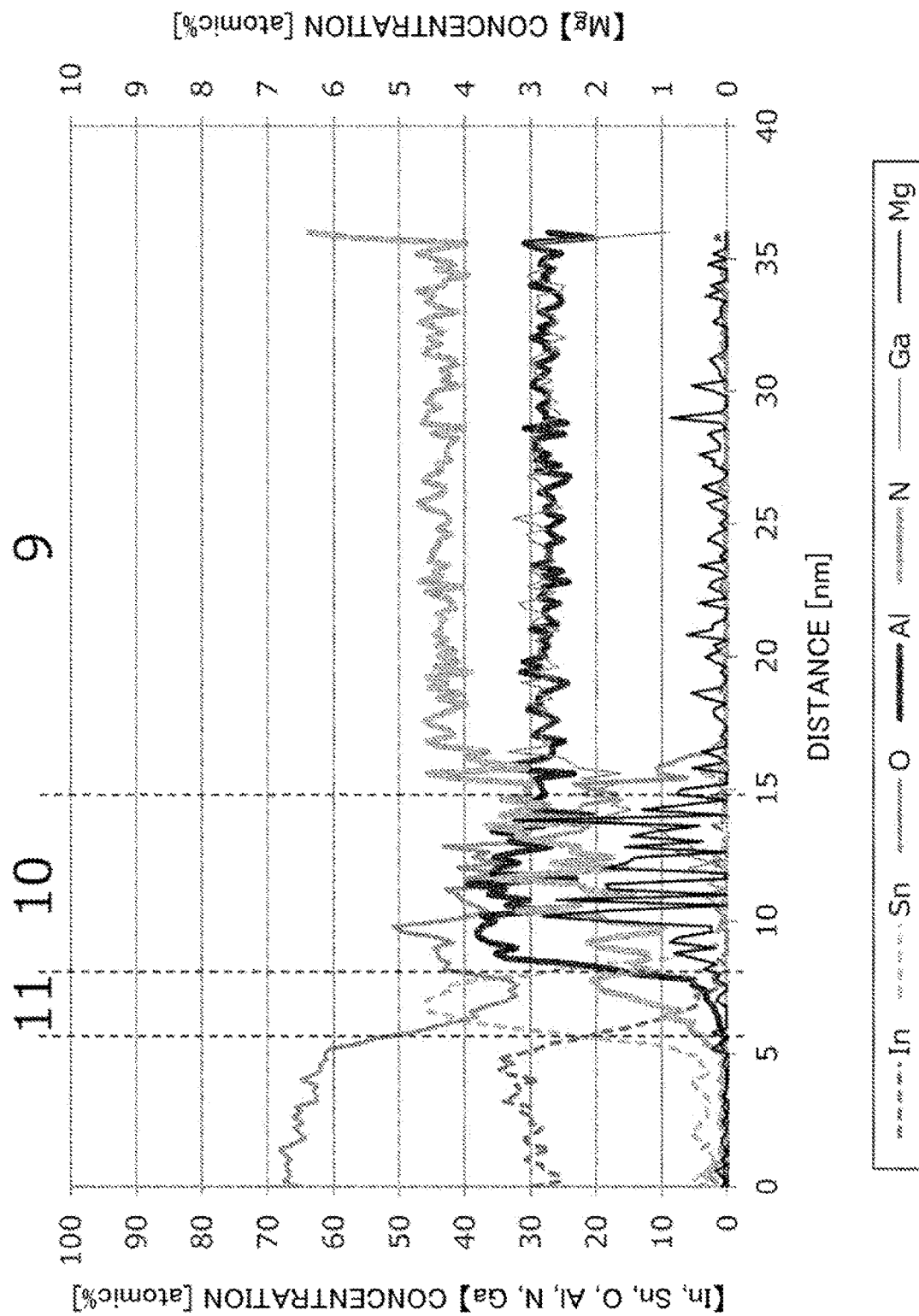
FIG. 4A is a concentration profile in a depth direction of a sample A without heat treating.

In order to check the concentration distribution of the elements of the second semiconductor layer 10 of the nitride semiconductor light emitting device of Example 1 and the layers near the second semiconductor layer 10, a sample A without heat treatment and a sample B with heat treatment were prepared. The sample A and the sample B were similar to Example 1 until the tin oxide layer 11 was formed. After that, the sample A was heat treated and the sample B was not heat treated. The conditions for heat treatment were 10 minutes at a temperature of 500 degrees C. in a vacuum. As for the sample A and the sample B, the results of the concentration profiles in the depth direction with the 3D atom probe are shown in FIGS. 4A and 4B. In both the sample A and the sample B, an ITO layer is formed on the tin oxide layer 11 as a capping layer for measurement. Only the Al target and the N target were used to form the second semiconductor layer 10, but as shown in FIG. 4A, the second semiconductor layer 10 contained Mg. It is probable that this is because Mg in the first semiconductor layer 9 diffused due to sputtering. The concentration of Mg in the second semiconductor layer 10 may be slightly increased by heat treatment, but if the second semiconductor layer 10 is sputtered, Mg can be diffused to the second semiconductor layer 10 prior to the heat treatment. In addition, from FIGS. 4A and 4B, it can be seen that O (oxygen) is also included in the second semiconductor layer. This is assumed to have been unintentionally oxidized during sputtering. FIGS. 4A and 4B indicate that in the second semiconductor layer 10, the content of O increases toward the top surface, and conversely, the content of N (nitrogen) decreases toward the top surface.

Examples 2 to 5

As Example 2, a nitride semiconductor light emitting device similar to Example 1 was manufactured except that the p-electrode 22 was configured as follows. As the p-electrode 22 in Example 2, the Ni layer (thickness: 5 nm), the Mg layer (thickness: 100 nm), the Ta layer (thickness: 30 nm), and the Ru layer (thickness: 50 nm) were formed sequentially from the side of the tin oxide layer 11. Thereafter, the p-electrode 22 was heat treated (in a vacuum, at 400 degrees C. for 10 minutes).

As Examples 3 to 5, a nitride semiconductor light emitting device similar to Example 2 was fabricated, except that the tin oxide layer 11 was not provided and the p-electrode 22 was formed on the upper surface of the second semiconductor layer 10. Because the second semiconductor layer 10 is formed by sputtering using an Al target and an N target, similarly to Example 1, it is assumed that the second semiconductor layer 10 mainly comprises Al, N, and O. The thickness of the second semiconductor layer 10 was 1 nm in Example 3, 3 nm in Example 4, and 5 nm in Example 5.

Table 1 below shows the forward voltage (Vf) for the nitride semiconductor light emitting devices of Examples 2 to 5 when the forward current is 20 mA. All of the nitride semiconductor light emitting devices of Examples 2 to 5 were normally driven as nitride semiconductor light emitting devices, similar to those of Example 1. Although Examples 3 to 5 are examples in which the tin oxide layer 11 is not provided, these results indicate that the nitride semiconductor light emitting device can be driven even without the tin oxide layer 11 on the second semiconductor layer 10. If the layer forming the p-electrode is not the p-type layer, the nitride semiconductor light emitting device may not exhibit diode characteristics and may not emit light. However, because the nitride semiconductor light emitting devices of Examples 2 to 5 emit light, that is indication that the p-type conversion of the second semiconductor layer 10 is successful in Examples 2 to 5. In addition, according to the results of Examples 3 to 5 shown in Table 1, when there is no tin oxide layer 11, the thickness of the second semiconductor layer 10 is preferably greater than 1 nm, and preferably 5 nm or less. Furthermore, the thickness of the second semiconductor layer 10 is more preferably 2 nm or more and 4 nm or less.

TABLE 1

|  | THICKNESS OF SECOND SEMICONDUCTOR LAYER [nm] | THICKNESS OF TIN OXIDE LAYER [nm] | $V_f$ [V] |
|---|---|---|---|
| EXAMPLE 2 | 3 | 5 | 9.8 |
| EXAMPLE 3 | 1 | — | 14.0 |
| EXAMPLE 4 | 3 | — | 10.0 |
| EXAMPLE 5 | 5 | — | 11.0 |

Examples 6 to 9

In Example 6, a nitride semiconductor light emitting device similar to Example 2 was manufactured except that the temperature of the heat treatment after forming the second semiconductor layer 10 and the tin oxide layer 11 was 600 degrees C. and the configuration of the p-electrode 22 was as follows. As the p-electrode 22 of Example 6, the Mg layer (thickness: 100 nm) and the Ru layer (thickness: 100 nm) were formed sequentially from the side of the tin oxide layer 11. Thereafter, the p-electrode 22 was heat treated (in a vacuum, at 400 degrees C. for 10 minutes).

In Examples 7 to 9, a nitride semiconductor light emitting device similar to Example 6 was fabricated except that the following points were not included. None of the nitride semiconductor light emitting device of Examples 7 to 9 include the tin oxide layer 11, and the p-electrode 22 was formed on the second semiconductor layer 10 (thickness: 3 nm). Because the second semiconductor layer 10 is formed by sputtering using an Al target and an N target, similarly to Example 1, it is assumed that the second semiconductor layer 10 comprises Al, N, and O mainly. The temperature of the heat treatment was 500 degrees C. in Example 7, 600 degrees C. in Example 8, and 700 degrees C. in Example 9.

Table 2 below shows the forward voltage (Vf) for the nitride semiconductor devices of Examples 6 to 9 at a forward current of 20 mA. From Table 2, it can be seen that the higher the temperature of the heat treatment relative to the second semiconductor layer 10, the lower the forward voltage can be. From TABLE 2, it can be said that the temperature of the heat treating at 500 degrees C. or more is preferable, at 600 degrees C. or more is more preferable, and at 700 degrees C. or more is even more preferable.

TABLE 2

| | THICKNESS OF SECOND SEMI-CONDUCTOR LAYER [nm] | THICKNESS OF TIN OXIDE LAYER [nm] | TEMPERATURE OF HEAT TREATMENT [° C.] | $V_f$ [V] |
|---|---|---|---|---|
| EXAMPLE 6 | 3 | 5 | 600 | 7.9 |
| EXAMPLE 7 | 1 | — | 500 | 9.0 |
| EXAMPLE 8 | 3 | — | 600 | 8.2 |
| EXAMPLE 9 | 5 | — | 700 | 7.9 |

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although certain embodiments of the present invention have been described in detail, it should be understood that the various changes, substitutions, and alterations could be made hereto without departing from the spirit and scope of the invention.

What is claimed is:

1. A method of manufacturing a nitride semiconductor device, the method comprising:
    forming a first semiconductor layer containing Al, Ga, and N and having a first thickness by doping a p-type impurity;
    forming a second semiconductor layer over the first semiconductor layer without doping an n-type impurity and without doping a p-type impurity, the second semiconductor layer containing Al and N and having a second thickness;
    heat treating the first semiconductor layer and the second semiconductor layer; and
    after the forming of the second semiconductor layer, forming a p-electrode in contact with a top surface of the second semiconductor layer,
    wherein the second thickness is less than the first thickness,
    wherein a band gap energy of the second semiconductor layer is greater than a band gap energy of the first semiconductor layer, and
    wherein, after the heat treating of the first semiconductor layer and the second semiconductor layer, the second semiconductor layer contains the p-type impurity by diffusion of the p-type impurity from the first semiconductor layer.

2. The method as claimed in claim 1, wherein the second semiconductor layer is formed by sputtering.

3. The method as claimed in claim 1, wherein the second semiconductor layer is formed in contact with a top surface of the first semiconductor layer.

4. The method as claimed in claim 1, wherein the heat treating of the first semiconductor layer and the second semiconductor layer is performed after the forming of the second semiconductor layer and before the forming of the p-electrode.

5. The method as claimed in claim 1, further comprising:
    before the forming of the first semiconductor layer, forming an n-type semiconductor layer by doping an n-type impurity; and
    before the forming of the first semiconductor layer, forming a light emitting layer over the n-type semiconductor layer.

6. The method as claimed in claim 5, wherein the light emitting layer is a layer configured to emit deep ultraviolet light.

7. The method as claimed in claim 5, further comprising:
    after the forming of the n-type semiconductor layer and before the forming of the second semiconductor layer, forming an n-electrode electrically connected to the n-type semiconductor layer; and
    after the forming of the n-type semiconductor layer and before the forming of the second semiconductor layer, heat treating the n-electrode.

8. The method as claimed in claim 7, wherein a temperature at which the first semiconductor layer and the second semiconductor layer is heat treated is lower than a temperature at which the n-electrode is heat treated.

9. The method as claimed in claim 1, wherein the first semiconductor layer and the second semiconductor layer are heat treated in a vacuum or in an atmosphere that is not an oxidation atmosphere.

10. The method as claimed in claim 1, wherein the first semiconductor layer and the second semiconductor layer are heat treated at a temperature of 400 degrees C. or higher and 900 degrees C. or lower.

11. The method as claimed in claim 1, wherein the first semiconductor layer is formed by doping the p-type impurity at a concentration of $2 \times 10^{19}$ cm$^{-3}$ or more and $6 \times 10^{19}$ cm$^{-3}$ or less.

12. The method as claimed in claim 1, wherein the first thickness is 30 nm or more and 600 nm or less.

13. The method as claimed in claim 1, wherein the second thickness is 1 nm or more and 20 nm or less.

14. The method as claimed in claim 1, wherein the p-type impurity is Mg.

15. A method of manufacturing a nitride semiconductor device, the method comprising:
    forming a first semiconductor layer containing Al, Ga, and N and having a first thickness by doping a p-type impurity;
    forming, by sputtering, a second semiconductor layer over the first semiconductor layer without doping an n-type impurity and without doping a p-type impurity, the second semiconductor layer containing Al and N and having a second thickness less than the first thickness and a band gap energy greater than a band gap energy of the first semiconductor layer;

heat treating the first semiconductor layer and the second semiconductor layer at a temperature of 400 degrees C. or higher and 900 degrees C. or lower; and forming a p-electrode in contact with a top surface of the second semiconductor layer, wherein, after the heat treating of the first semiconductor layer and the second semiconductor layer, the second semiconductor layer contains the p-type impurity.

16. The method as claimed in claim 15, further comprising:

before the forming of the first semiconductor layer, forming an n-type semiconductor layer by doping an n-type impurity; and before the forming of the first semiconductor layer, forming a light emitting layer over the n-type semiconductor layer.

17. The method as claimed in claim 16, further comprising:

after the forming of the n-type semiconductor layer and before the forming of the second semiconductor layer, forming an n-electrode electrically connected to the n-type semiconductor layer; and after the forming of the n-type semiconductor layer and before the forming of the second semiconductor layer, heat treating the n-electrode.

18. The method as claimed in claim 15, wherein the first semiconductor layer and the second semiconductor layer are heat treated in a vacuum or in an atmosphere that is not an oxidation atmosphere.

19. The method as claimed in claim 15, wherein the second thickness is 1 nm or more and 20 nm or less.

20. A method of manufacturing a nitride semiconductor device, the method comprising:

forming an n-type semiconductor layer by doping an n-type impurity;

forming a light emitting layer over the n-type semiconductor layer;

after the forming of the n-type semiconductor layer and the forming of the light emitting layer, forming a first semiconductor layer containing Al, Ga, and N and having a first thickness by doping a p-type impurity;

after the forming of the n-type semiconductor layer, forming an n-electrode electrically connected to the n-type semiconductor layer, and heat treating the n-electrode;

after the forming and heat treating of the n-electrode, forming a second semiconductor layer over the first semiconductor layer without doping the n-type impurity and without doping the p-type impurity, the second semiconductor layer containing Al and N and having a second thickness; and heat treating the first semiconductor layer and the second semiconductor layer, wherein the second thickness is less than the first thickness, wherein a band gap energy of the second semiconductor layer is greater than a band gap energy of the first semiconductor layer, and wherein, after the heat treating of the first semiconductor layer and the second semiconductor layer, the second semiconductor layer contains the p-type impurity by diffusion of the p-type impurity from the first semiconductor layer.

* * * * *